(12) United States Patent
Chen et al.

(10) Patent No.: US 8,413,025 B2
(45) Date of Patent: Apr. 2, 2013

(54) METHOD OF HANDLING PACKET LOSS USING ERROR-CORRECTING CODES AND BLOCK REARRANGEMENT

(75) Inventors: Huan Chen, Min-Hsiung Chia-Yi (TW); Hsi-Hsun Yeh, Min-Hsiung Chia-Yi (TW); Wei-Ming Wu, Min-Hsiung Chia-Yi (TW)

(73) Assignee: National Chung Cheng University, Min-Hsiung, Chia-Yi (TW)

( * ) Notice: Subject to any disclaimer, the term of this patent is extended or adjusted under 35 U.S.C. 154(b) by 358 days.

(21) Appl. No.: 12/859,794

(22) Filed: Aug. 20, 2010

(65) Prior Publication Data

US 2011/0283168 A1    Nov. 17, 2011

(30) Foreign Application Priority Data

May 14, 2010 (TW) ............................. 99115488 A

(51) Int. Cl.
 *H03M 13/00* (2006.01)
(52) U.S. Cl. ..................................... 714/782

(58) Field of Classification Search ............... 714/782
See application file for complete search history.

(56) References Cited

U.S. PATENT DOCUMENTS

| | | | |
|---|---|---|---|
| 2005/0149820 A1* | 7/2005 | Gastaldello et al. | 714/758 |
| 2009/0049359 A1* | 2/2009 | Malladi et al. | 714/752 |
| 2010/0034307 A1* | 2/2010 | Jeong et al. | 375/265 |
| 2011/0010608 A1* | 1/2011 | Kim et al. | 714/776 |
| 2011/0138256 A1* | 6/2011 | Betts | 714/777 |
| 2011/0154155 A1* | 6/2011 | Abu-Surra et al. | 714/756 |

* cited by examiner

*Primary Examiner* — Michael Maskulinski
*Assistant Examiner* — Neil Miles
(74) *Attorney, Agent, or Firm* — McClure, Qualey & Rodack, LLP

(57) ABSTRACT

A method of handling packet loss uses error-correcting codes and block rearrangement. This method divides the original data stream into data blocks, then codes the blocks by error-correcting codes. After coding the blocks, rearranges the coding blocks for spreading original data into new blocks and then transmitting the new blocks.
After receiving the transmitted blocks, reverse-rearrangs the received blocks and decode the blocks. Combine the decoded blocks into original data stream in the end.

2 Claims, 14 Drawing Sheets

| 0 | 1 | 2 | 3 | 4 | 5 | 6 | 7 | 8 | 9 | 10 | 11 | 12 | 13 | 14 | 15 | 16 | 17 | 18 | 19 |

FIG.12

| 10 | 6 | 14 | 1 | 17 | 18 | 3 | 7 | 0 | 11 | 13 | 2 | 16 | 8 | 12 | 4 | 9 | 19 | 15 | 5 |

FIG.13

METHOD OF HANDLING PACKET LOSS USING ERROR-CORRECTING CODES AND BLOCK REARRANGEMENT

This application claims the benefit of Taiwan Application Serial No. 99115488, filed May 14, 2010, the subject matter of which is incorporated herein by reference.

BACKGROUND OF THE INVENTION (1) Field of the Invention

The present invention relates to an error code correction method on a digital communication system, and more particularly to an error code correction method using the combination of error correction codes and block rearrangement to solve the packet loss issue.

(2) Description of the Prior Art

In the transmission of the digital signals, the distortion and errors generated by the timevarying decay and the Gaussian white noise are inevitable.

However, due to the help of the Error Correction Codes technology, digital signal transmission has a certain ability to recover signals from channel noise interference. And thus, error correction codes improve and enhance digital transmission reliability.

FIG. 1 shows a simplified digital signal transmission process. The original digital data stream signal M1 is divided into segment blocks in the step 100 and then each block is added by a header in step 110. An error correction coding is applied to each block in step 210 to become the signal c and the signal c is transmitted via the channel in step 500.

A receiver receives the received signal R from the channel. As may be subject to noise interference or packet loss, the signal R can be expressed as R=C+e, where e is the noise. Afterwards, an error correction decoding is applied to the signal R in step 810 and then the head of to each block is removed in step 820. Each block is recombined into a digital data stream M2. If the digital data stream M2 is the same as the digital data stream M1, the signal transmission succeeds by the help of the Error Correction Codes technology in step 210 and 810. If the digital data stream M2 is not the same as the digital data stream M1, the Error Correction Codes technology in step 210 and 810 can not overcome the channel noise interference or packet loss during the transmission in step 500.

In recent years, the error correction coding mainly is divided into two categories: linear block codes and nonlinear block codes. The Reed-Solomon Code (RS code) and Low Density Parity Check Codes (LDPC code) are the best known and most widely used linear block codes.

RS code is proposed by Reed and Solomon in 1960 and an error correction code of a wide variety application with very good performance. It can not only correct the random errors but also correct the sudden Error (Burst error).

Low Density Parity Check Codes (LDPC codes for short) is proposed by Gallager in 1962. It is a method of iterative decoding. However, by the limited computer hardware performance at that time, the LDPC code was not taken serious attention by academia. Until 1993, when Berrou et al proposed Turbo codes, people accidently rediscovered LDPC codes have excellent performance and great value in implementation by the research of Turbo codes.

When the academic community reexamined the LDPC code, people found that if the code length is longer, the LDPC code can be closer to the Shannon Limit than the Turbo code. D. MacKay in 1996 proved that an iterative algorithm of LDPC codes can be with excellent performance approaching Shannon limit, or even irregular LDPC code can be with excellent performance approaching the Shannon limit with only the 0.0045 dB distance. So, following the Turbo code, LDPC codes attracts popular attention in channel coding theory recent years. Studies have shown that, by the iterative algorithm using the BP (Belief Propagation) algorithm, LDPC codes can be used with lower hardware complexity to achieve performance approaching Shannon limit.

On the research of RS codes and LDPC codes, a lot of works are related to error correction codes or even the research on the erasure codes. But their researches in the processing of packet loss are actually not many. We consider a packet loss situation by the help of FIG. 2. FIG. 2 represents the segment blocks after the block segmentation step 100 of FIG. 1. Each block length is f bits in the segment blocks. Therefore, if we lost a block, we lost continuous f bits. Thus, as long as the number of packet loss increases, the recovery of received digital signals by the error correction codes become serious difficult.

In order to enhance the recovery ability of error correction codes technology, many researches have used the cascade code (or concatenation code). The coding process combines two coding processes called inside and outside codes. But the inside and outside the codes uses different codes separately, for example the traditional DVB adopts the RS code as well as the convolution code. This approach certainly promoted the restoration effect, but their effect is still made little!

In 2006, Sarah J. Johnson in "ERASURE CORRECTING LDPC CODES FOR CHANNELS WITH PACKETS LOSSES" has proposed to solve the problem of packet loss. But the literature does not explain the design of the packet and Hperm. This is because the Hperm has its degree of difficulty truly in the design. In particular, for handling multiple packet loss problems, in order to ensure that one packet loss (random) can be resolved through other packets (i.e. uses Hperm), the difficulty of the Hperm design will be increased as lost packets number increases. So the implementation will face great challenges.

Therefore, in the noise and the packet loss environment, the research on how to transmit digital signals completely was still defective.

SUMMARY OF THE INVENTION

It is an object of the present invention to provide a method of handling packet loss and noise distortion using errorcorrecting codes and block rearrangement.

This invention proposed a method to reduce the packet loss impact on the recovery ability of error correction codes: applying the block rearrangement to segment blocks to make up the insufficient recovery ability of error correction codes technology.

The followings are another object of the present invention to provide a method of handling packet loss and noise distortion. This method comprises the steps of: (a) dividing the data stream signal into segment blocks; (b) applying the first error correction code coding on the segment blocks; (c) applying the block rearrangement on the segment blocks to break up the data of each segment blocks and spread the data into new formed segment blocks; (d) transmitting the new formed segment blocks via a channel with noise; (e) applying the received signals with reverse block rearrangement to restore the spread data; (f) applying the first error correction code decoding on the reverse rearrangement block and (g) combining these reverse rearrangement blocks back to the original data stream signal.

The followings are another object of the present invention to provide a method of handling packet loss and noise distortion. This method comprises the steps of: (a) dividing the data stream signal into segment blocks; (b) applying a first error correction code coding on the segment blocks; (c) applying the block rearrangement on the segment blocks to break up the data of each segment blocks and spread the data into new formed segment blocks; (d) applying a second error correction code coding on the segment blocks; (e) transmitting the segment blocks via a channel with noise; (f) applying the second error correction code decoding on the received blocks; (g) applying the received blocks with reverse block rearrangement to restore the spread data; (h) applying the first error correction code decoding on the block and (i) combining these reverse rearrangement blocks back to the original data stream signal. The above steps combine two error correction code technologies and a block rearrangement to solve the problem of packet loss and channel noise interference.

The features, objects, and advantages of the present invention will become more apparent from the following detailed description of the preferred embodiment of this invention, with reference to the accompanying drawings:

BRIEF DESCRIPTION OF THE DRAWINGS

FIG. 12 is a graph illustrating the parity check matrix array in accordance with the third embodiment of the present invention;

FIG. 13 is a graph illustrating the parity check matrix array in accordance with the third embodiment of the present invention;

DESCRIPTION OF THE PREFERRED EMBODIMENT

Figure 1:
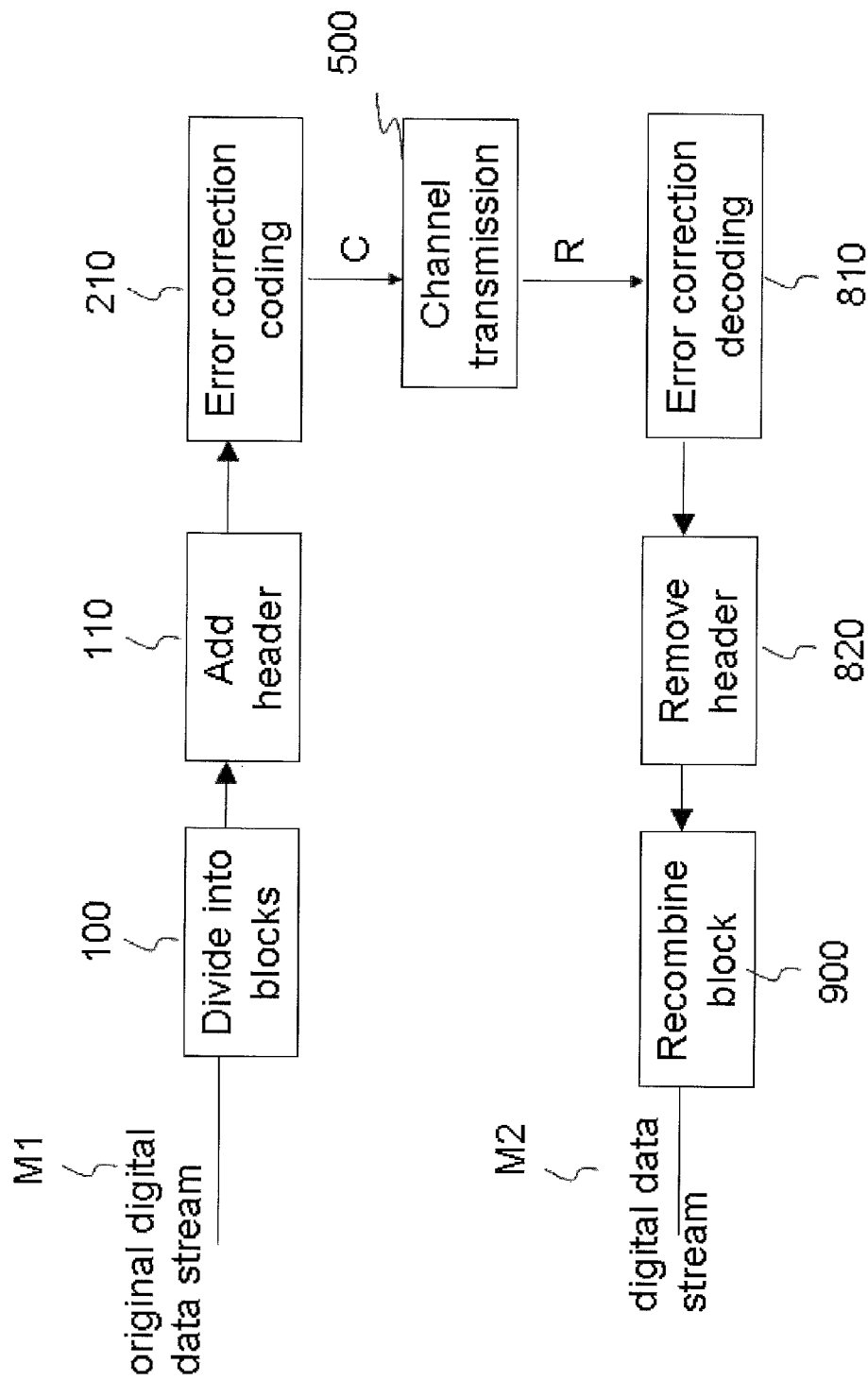
FIG. 1 is a flow chart showing conventional digital signal transmission processes with error code correction technology.
Figure 2:
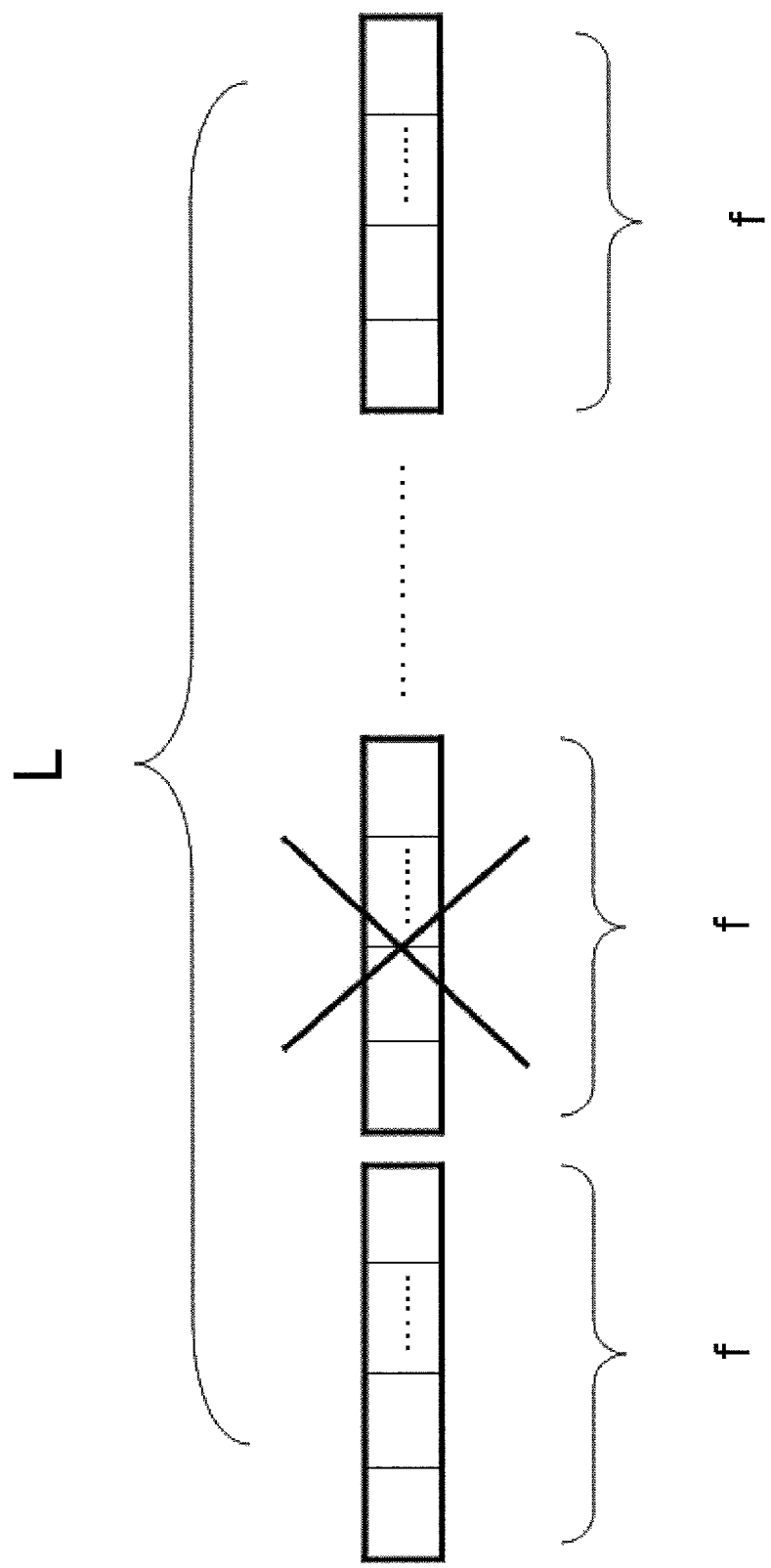
FIG. 2 is a graph showing the packet loss in a data stream.
Figure 3:
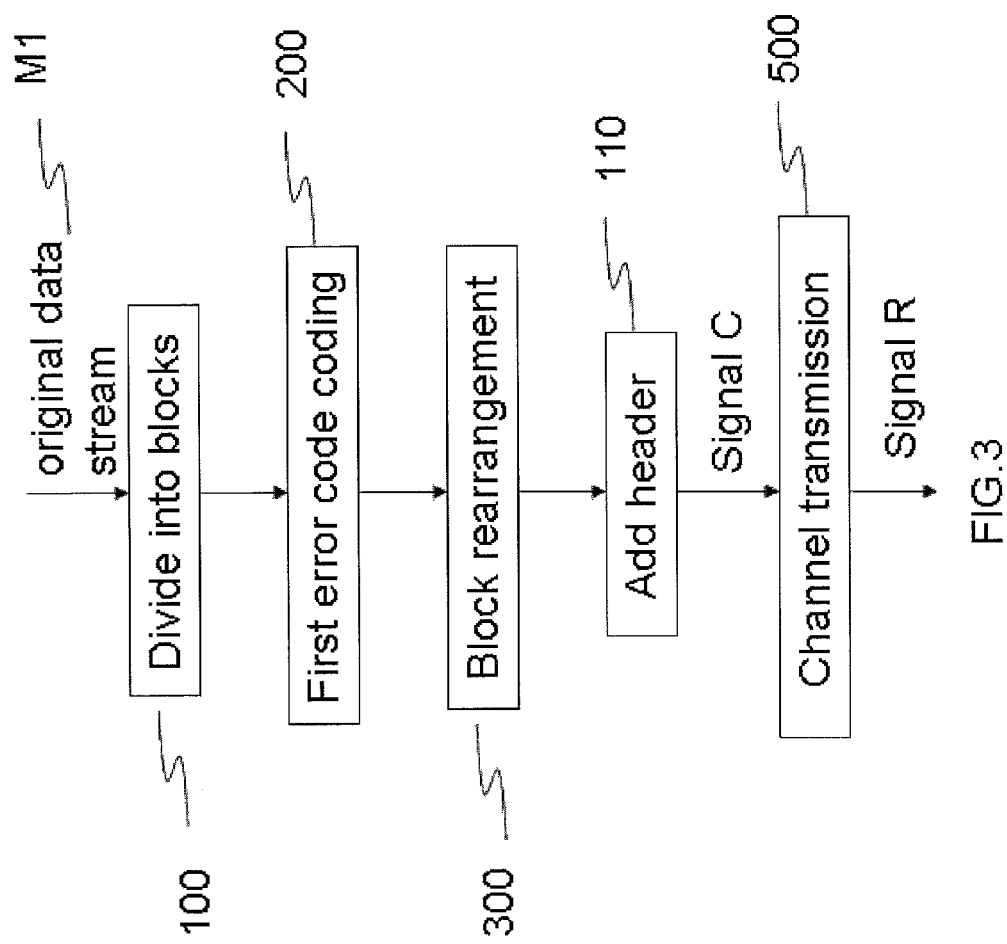
FIG. 3 is a flow chart showing the encoding process in accordance with the first embodiment of the present invention.

FIG. 3 is a flow chart showing the encoding process in accordance with the first embodiment of the present invention. After the block segmentation of the original data stream M1 in step 100, the original data stream M1 is divided into a plurality of fixed-size blocks. Then in the step 200, a first error correction code coding is applied to each fixed-size block, and then a block rearrangement is applied to the first error correction code encoded blocks in step 300. The purpose of the block rearrangement is to break up the data of each encoded blocks and spread the broken-up data into new formed segment blocks. After the block rearrangement, a header is added in each block to become signal C in step 110 and then the signal C is transmitted via the channel in step 500. The signal C is composed of a plurality of blocks(pockets) with header.

The above first error correction code of FIG. 3 can be any kind of error correction codes, such as Turbo Code, Rod-Solomon code (RS code), and low density parity check code (LDPC code), BCH code, eIRA code, QCLDPC codes . . . and so on.

Figure 4:
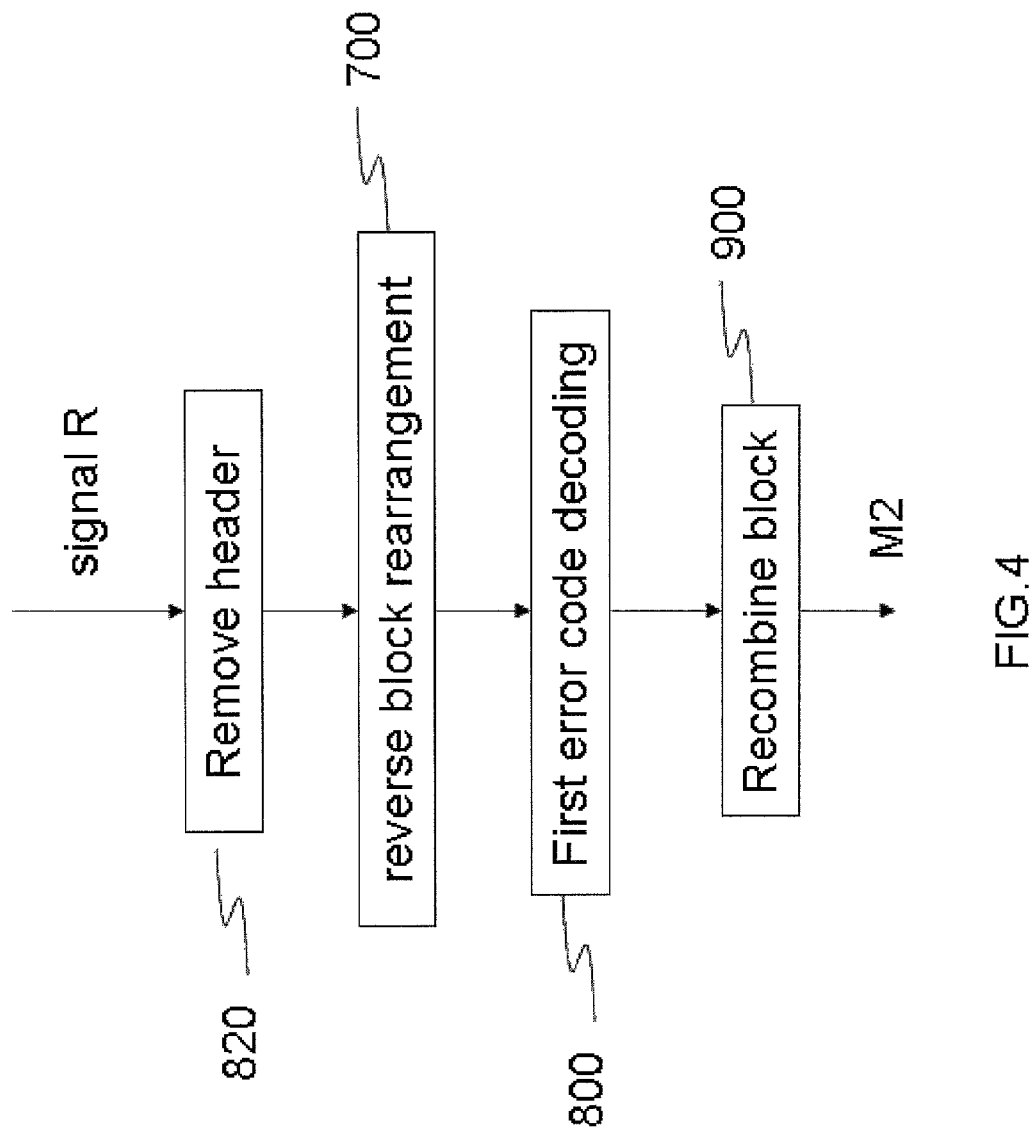
FIG. 4 is a flow chart showing the decoding process in accordance with the first embodiment of the present invention.

FIG. 4 is a flow chart showing the decoding process in accordance with the first embodiment of the present invention. After the transmission through the channel, the received signal R may be different from the signal C because of channel noise and packet loss. The header of each block(pocket) of the received signal R is removed in step 820, and then a reverse block rearrangement is applied to the blocks to restore the spread data from every blocks in step 700. Then the first error correction code decoding is applied to each block in step 800 and the blocks are combined to become data M2 in step 900. If the data stream M2 of FIG. 4 is the same as the data stream M1 of FIG. 3, the coding and decoding processes can overcome the channel noise and packet loss issues during channel transmission.

Figure 5:
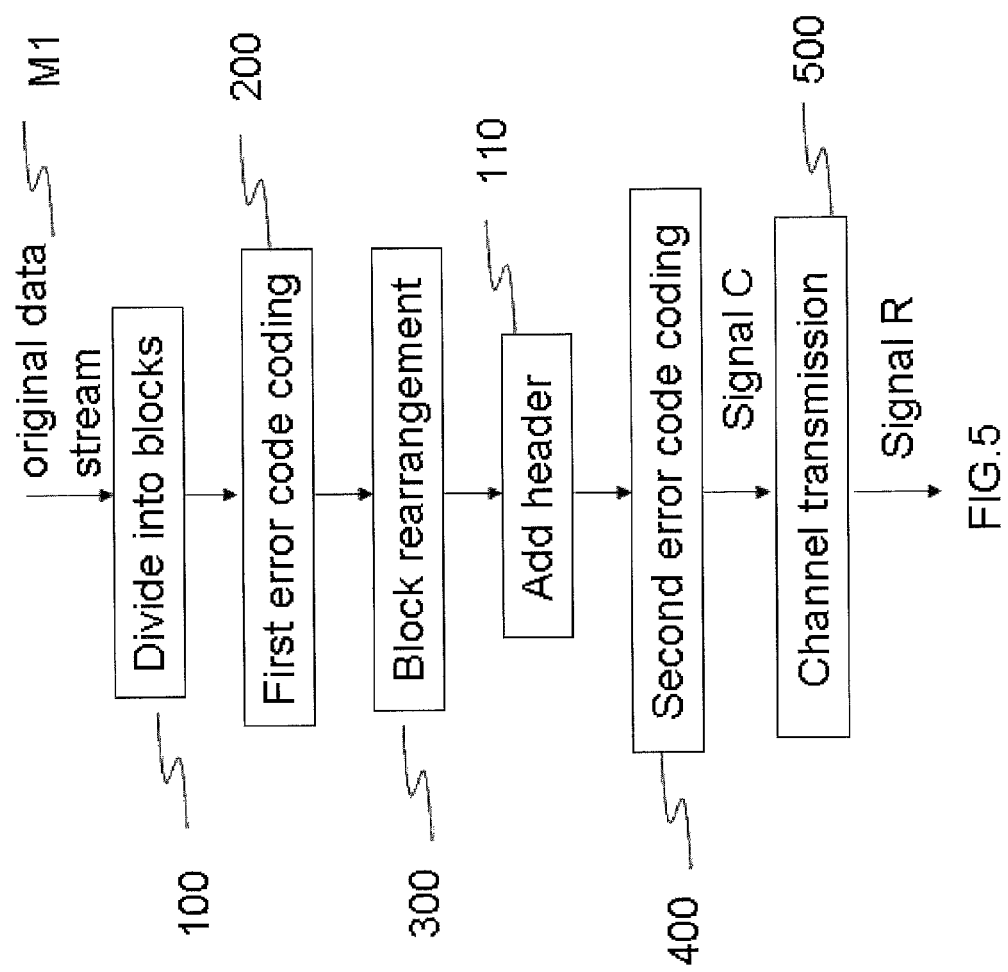
FIG. 5 is a flow chart showing the encoding process in accordance with the second embodiment of the present invention.

FIG. 5 is a flow chart showing the encoding process in accordance with the second embodiment of the present invention. After the block segmentation of the original data stream M1 in step 100, the original data stream M1 is divided into a plurality of fixed-size blocks. Then in the step 200, a first error correction code coding is applied to each fixed-size block, and then a block rearrangement is applied to the first error correction code encoded blocks in step 300. The purpose of the block rearrangement is to break up the data of each encoded blocks and spread the broken-up data into new formed segment blocks. After the block rearrangement, a header is added in each block in step 110 and a second error correction code coding is applied to each block to become signal C in step 400, and then the signal C is transmitted via the channel in step 500. The signal C is composed of a plurality of blocks(pockets) with headers.

The above first and second error correction code of FIG. 5 can be any kind of error correction codes, such as Turbo Code, Rod-Solomon code (RS code), and low density parity check code (LDPC code), BCH code, eIRA code, QCLDPC codes . . . and so on.

Figure 6:
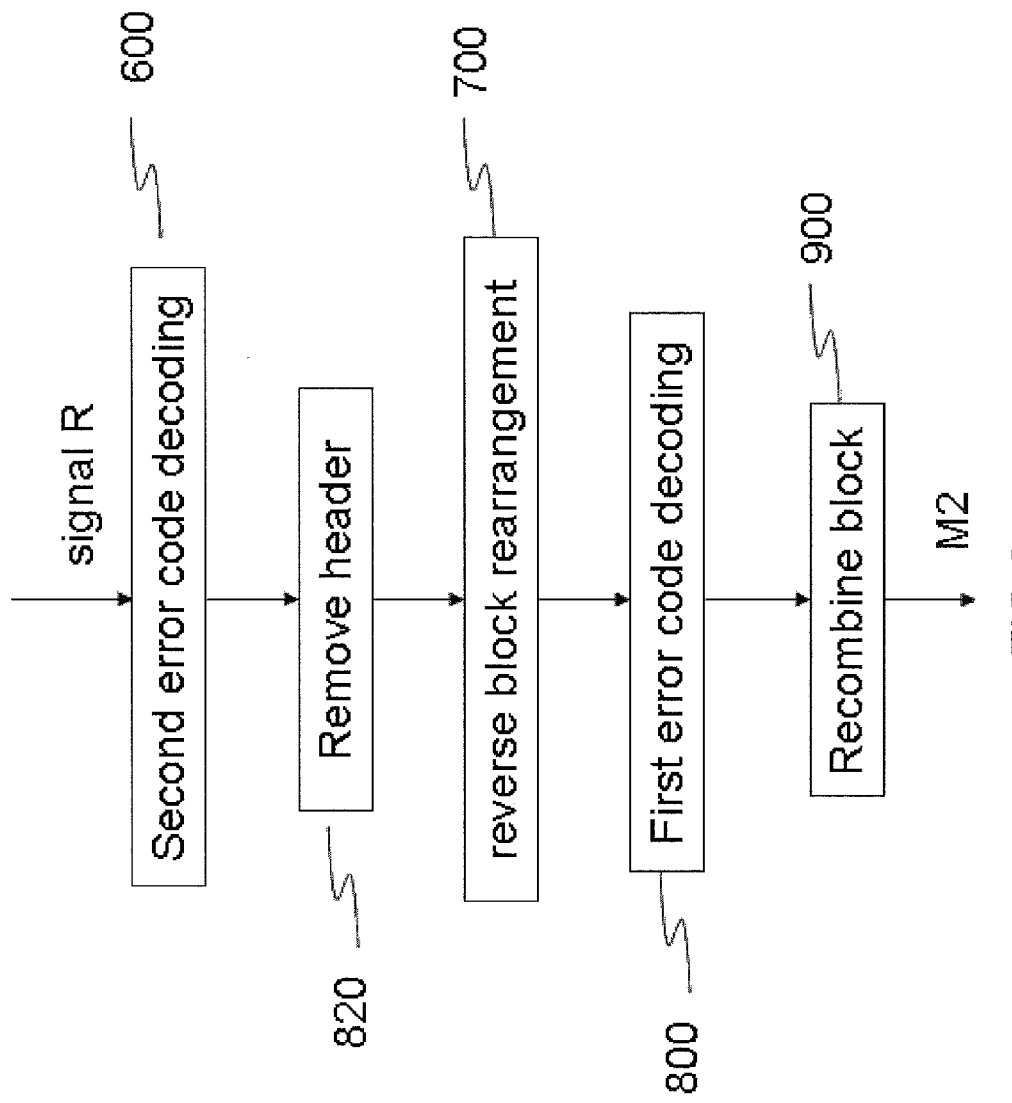
FIG. 6 is a flow chart showing the decoding process in accordance with the second embodiment of the present invention.

FIG. 6 is a flow chart showing the decoding process in accordance with the second embodiment of the present invention. After the transmission through the channel, the received signal R may be different from the signal C because of channel noise and packet loss. A second error correction code decoding is applied to each block(pocket) of the received signal R in step 600 and the header of each block(pocket) of the received signal R is removed in step 820, and then a reverse block rearrangement is applied to the blocks to restore the spread data from every blocks in step 700. Then the first error correction code decoding is applied to each block in step 800 and the blocks are combined to become data M2 in step 900. If the data M2 of FIG. 6 is the same as the data stream M1 of FIG. 5, the coding and decoding processes can overcome the channel noise and packet loss issues during channel transmission.

Figure 7:
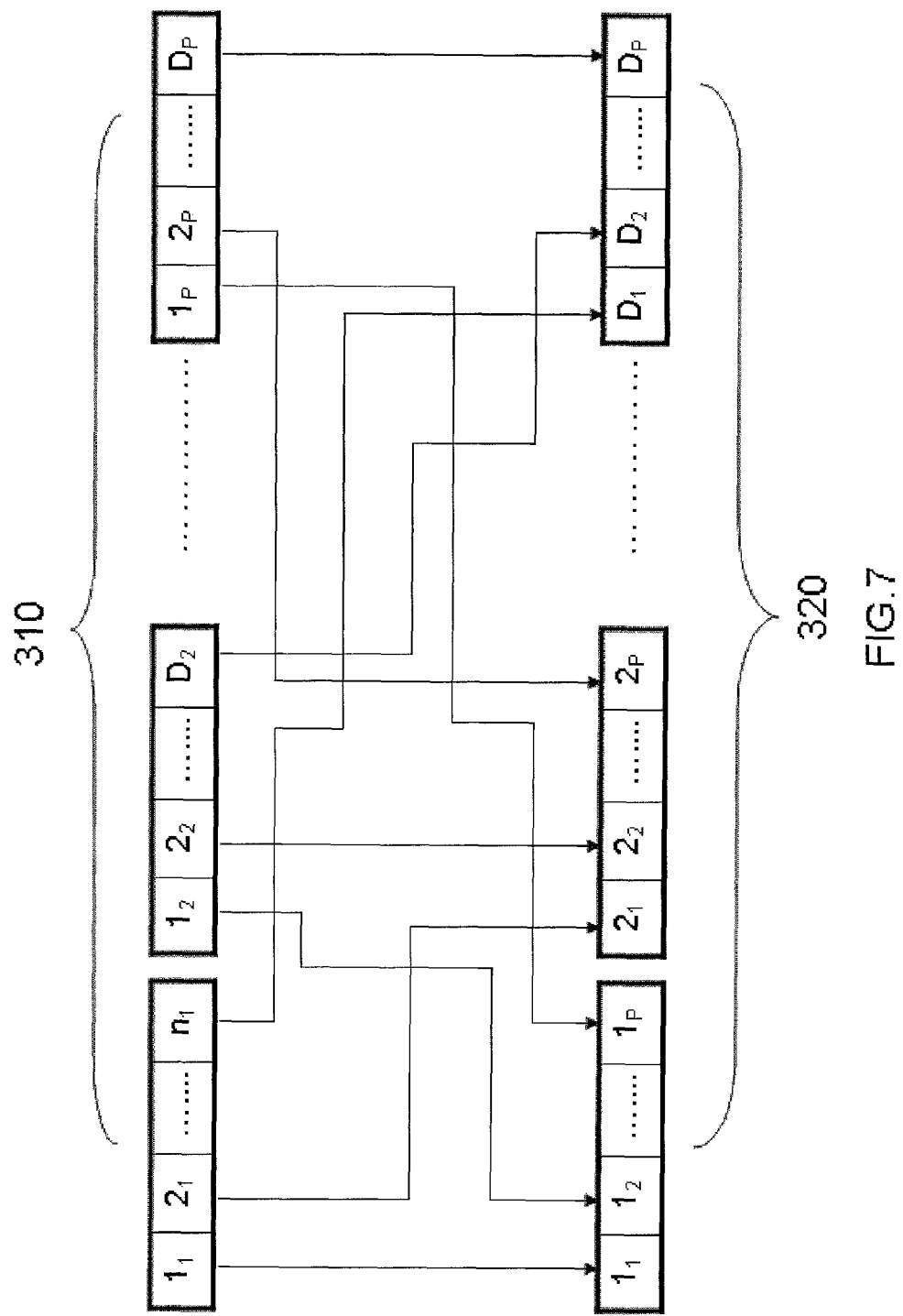
FIG. 7 is a graph showing the block rearrangement in accordance with the present invention.

FIG. 7 illustrates the step 300 of FIG. 3 and FIG. 5, i.e. the block rearrangement of the present invention. First, we define the following symbols: Dp is the Dth code word (or bit) of the Pth block and the Dp can be binary (binary) or nonbinary (nonbinary). For example, $1_2$ represents 1st code word (or bit) of the second block. The upper row 310 represents the blocks before block rearrangement, while the lower row 320 represents the blocks after the block rearrangement. The 1st code word (or bit) of each block in the upper row 310 are placed to the 1st block of the lower row 320 in sequence; Similarly, then 2nd code word (or bit) of each block in the upper row 310 are placed to the 2nd block of the lower row 320 in sequence, . . . , and so on, thus we can complete the block rearrangement. If the blocks of the upper row 310 contains P blocks and each block contains D code words(or bits), then the lower row 320 after rearrangement is a row with D blocks and each block contain P code word (or bits).

Figure 8:
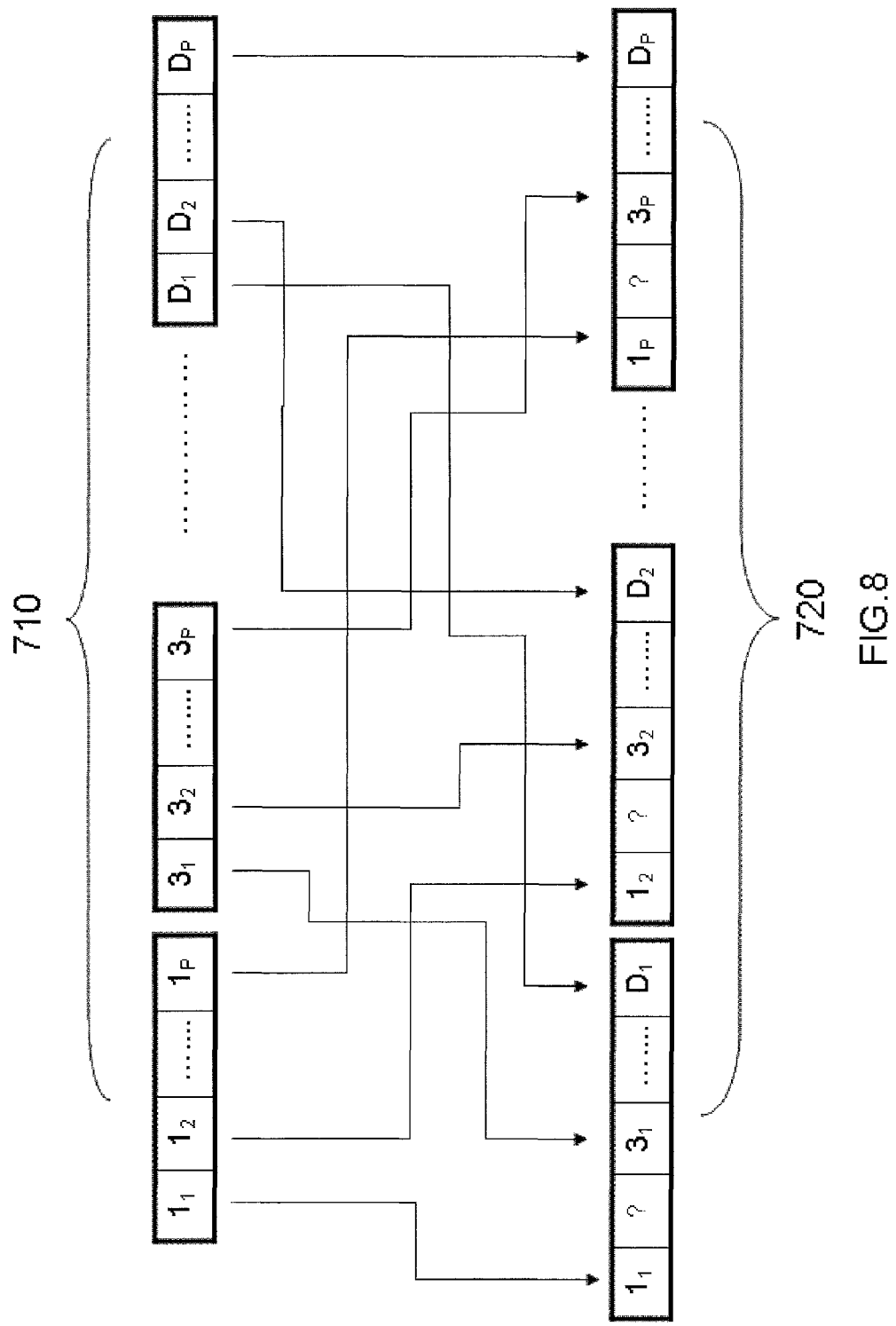
FIG. 8 is a graph showing the reverse block rearrangement in accordance with the present invention.

FIG. 8 is the step 700 of FIG. 4 and FIG. 6, i.e. the reverse block rearrangement of the present invention. The upper row 710 represents the blocks before reverse block rearrangement, while the lower row 720 represents the blocks after the reverse block rearrangement and we assume that the second block were lost during channel transmission. The code words (or bits) of the first block in the upper row 710 are placed to the first code word (or bit) of every blocks in the lower row 720 one by one; Similarly, The code words (or bits) of the 3rd block in the upper row 710 are placed to the 3rd code word (or bit) of every blocks in the lower row 720 one by one, . . . , and so on, thus we can complete the reverse block rearrangement. The 2nd code word (or bit) of each block in the lower row 720 is unknown because of the lost of the second block(or pocket). The unknown word (or bit) of each block from the lost pocket can be restored by the error code correction technology or the erase code correction technology.

From FIG. 3 to FIG. 8, we can see that the present invention can transform the pocket lost issue into a erased code issue by the help of the block rearrangement step 300 and reverse block rearrangement step 700. And then the error code technology or erased code technology can be applied to restore the lost data.

Figure 9:
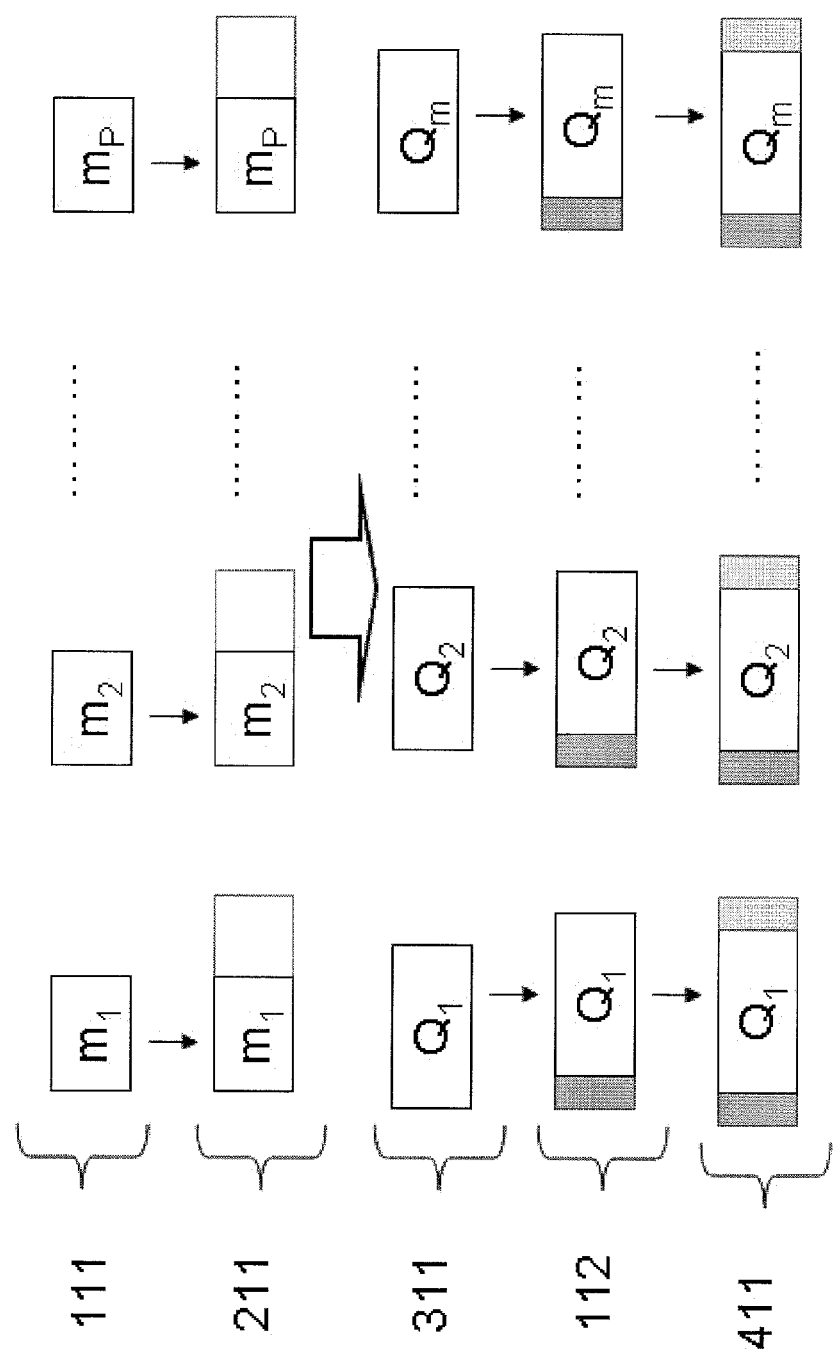
FIG. 9 is a graph showing the encoding process in accordance with the second embodiment of the present invention.

FIG. 9 illustrates the encoding process in accordance with the second embodiment of the present invention, i.e. from step 100 to step 400 of FIG. 5. Please also refer to FIG. 5, the 1st row 111 of FIG. 9 represents the blocks after block segmentation. The first error correction code encodes each block of the row 111 to become each block of 2nd row 211 and the check bits are added to the end of each block of the 2nd row 211. The block rearrangement is applied to the 2nd row 211 to become the 3rd row 311. Each block of the 3rd row 311 is added by a header to become the 4th row 112. The second error correction code encodes each block of the row 112 to become each block of 5th row 411 and the check bits are added to the end of each block of the 5th row 411. Then the 5th row 411 can be transmitted through the channel.

Figure 10:
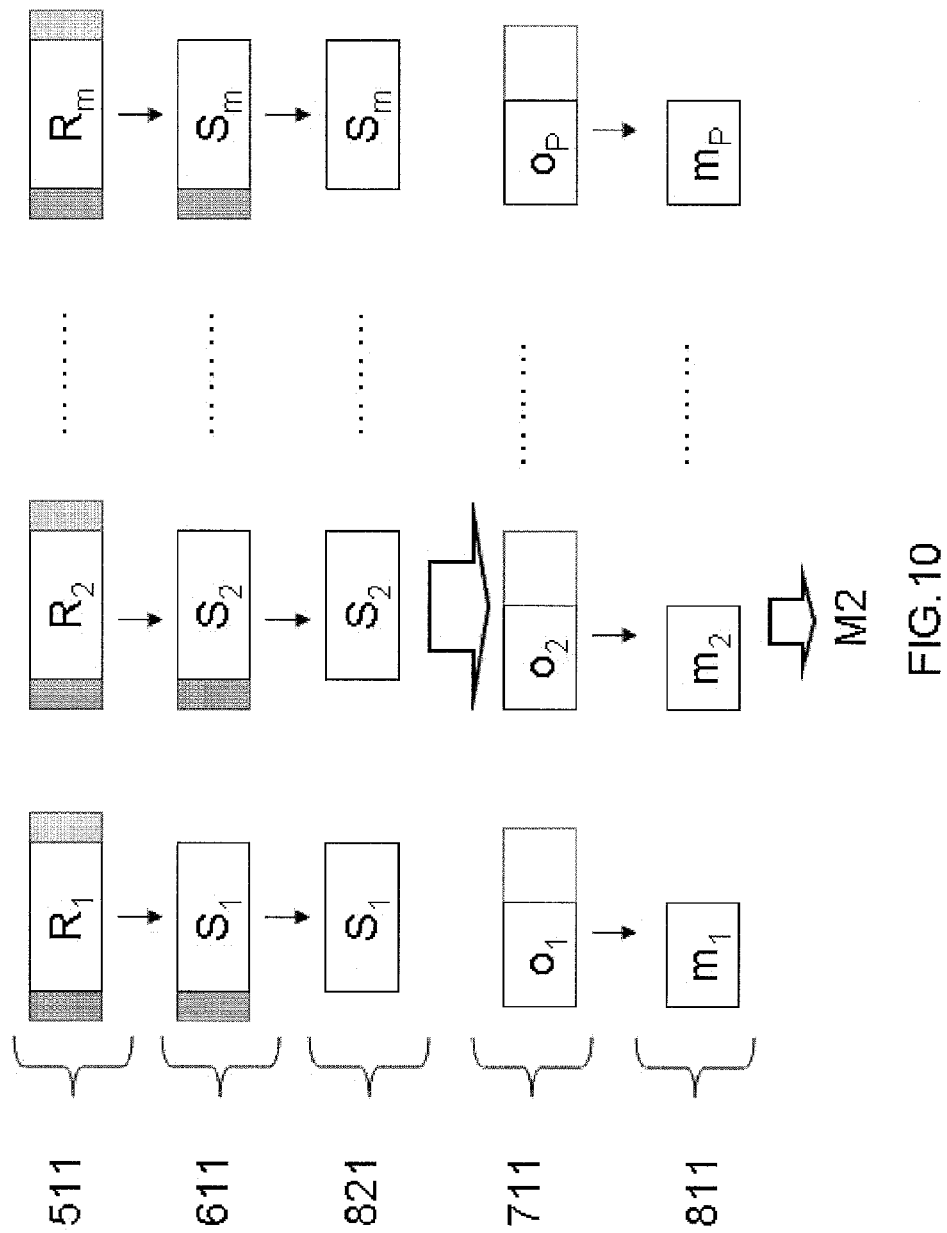
FIG. 10 is a graph showing the decoding process in accordance with the second embodiment of the present invention.

FIG. 10 illustrates the decoding process in accordance with the second embodiment of the present invention, i.e. from step 600 to step 800 of FIG. 6. Please also refer to FIG. 6, the 1st row 511 of FIG. 10 represents the received blocks(pockets). The second error correction code decodes each block of the row 511 to become each block of 2nd row 611 and the check bits are removed from the end of each block of the 2nd row 611. The header of each block of the 2nd row 611 is removed to become the 3rd row 821. The reverse block rearrangement is applied to the 3rd row 821 to become the 4th row 711. The first error correction code decodes each block of the 4th row 711 to become each block of 5th row 811 and the check bits are removed from the end of each block of the 5th row 811. Then the 5th row 811 are combined into digital data M2.

The third embodiment of the present invention adopts RS code as the first error correction code and LDPC code as the second error correction code in FIG. 5. We describe the RS coding and decoding procedures of the third embodiment as follows:

In the RS code coding procedure, if the data code word (i.e. the message) length is k, the encoded code word length is n, t is the maximum number of errors corrected and k satisfies n−k=2t. The generating polynomial g(x) is:

$$g(x) = \prod_{i=b}^{b+2t-1} (x - \alpha^i)$$

The $\alpha$ is the element of a finite field GF ($2^m$). To generate the elements of GF ($2^m$) requires a primitive polynomial $\rho$ (x), and a is the root of $\rho$ (x).

With the generating polynomial g (x), we can encode the message as follows: First of all, the original message will be transformed into a polynomial m (x). The polynomial m (x) is encoded to become a polynomial C (x), wherein C (x) is:

$$C(x) = x^{n-k} \cdot m(x) + r(x)$$

The $\gamma$(x) is the remainder of the polynomial $x^{n-k} \cdot m(x)$ divided by polynomial g(x).

Figure 11:
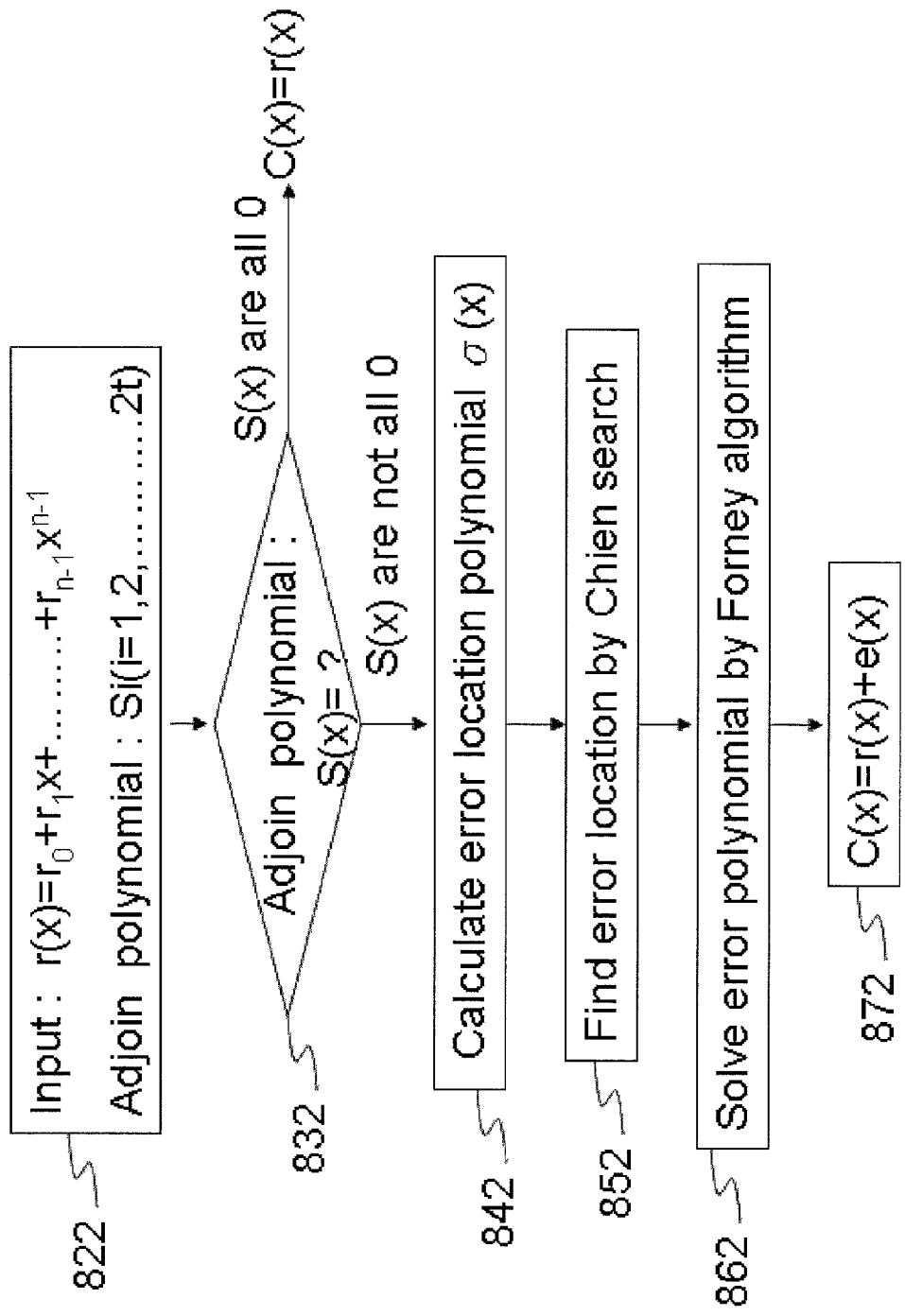
FIG. 11 is a flow chart showing the decoding process in accordance with the third embodiment of the present invention.

FIG. 11 is a flow chart showing the RS decoding process in accordance with the third embodiment of the present invention. The received signal is the polynomial r (x) in step 822 and the polynomial r (x) is:

$$r(x) = r_{n-1}x^{n-1} + r_{n-1}x^{n-2} + \ldots + r_1 x + r_0 = \sum_{i=0}^{n-1} r_i x^i$$

We assume that receiving polynomial r (x)=C (x)+e (x) and e (x) is the error polynomial. The adjoin(or symptom) polynomial of receiving polynomial r (x) is S(x) and S(x) is:

$$S = r \cdot H^T = (S_1, S_2, \ldots, S_n)$$

and the parity check matrix H is, $$H = \begin{bmatrix} 1 & \alpha & \alpha^2 & \ldots & \alpha^{n-1} \\ 1 & \alpha^2 & (\alpha^2)^2 & \ldots & (\alpha^2)^{n-1} \\ 1 & \alpha^3 & (\alpha^3)^2 & \ldots & (\alpha^3)^{n-1} \\ \vdots & \vdots & \vdots & \ddots & \vdots \\ 1 & \alpha^{2t} & (\alpha^{2t})^2 & \ldots & (\alpha^{2t})^{n-1} \end{bmatrix}$$

The adjoin polynomial S(x) is:

$$S_i = r(\alpha^i) = r_{n-1}\alpha^{(n-1)i} + r_{n-2}\alpha^{(n-2)i} + \ldots + r_1\alpha^i + r_0$$

i.e.

$$S_i = \sum_{j=0}^{n-1} r_j (\alpha^i)^j$$

Where in i=1, 2, . . . , 2t○
And then $$r(x)=c(x)+e(x)$$
$$\Rightarrow r(\alpha^i)=c(\alpha^i)+e(\alpha^i)$$
$$\Rightarrow S_i=c(\alpha^i)+e(\alpha^i)$$

In the decision step 832 of FIG. 11, if all the $S_i(x)$s are equal to 0, the receiving polynomial r(x) is the same as polynomial C(x) and the receiving signal is received without distortion or noise. Thus the RS decoding process is finished. If any Si (x) are not 0, then go to the next step 842.

Since c ($\alpha$)=0, so we can get r ($\alpha^i$)=e ($\alpha^i$) and we assume that there are r numbers of errors of e (x) in the $$x^{j1}, x^{j2}, \ldots, x^{jr}$$

i.e.

$$e(x)=x^{j1}+x^{j2}+\ldots+x^{jr}$$

Wherein $0 \leq j_1 < j_2 < \ldots < j_r$○ So we can get the following $S_i$:

$$S_1 = \alpha^{j1} + \alpha^{j2} + \ldots + \alpha^{jr}$$
$$S_2 = (\alpha^{j1})^2 + (\alpha^{j2})^2 + \ldots + (\alpha^{jr})^2$$
$$\vdots$$
$$S_{2t} = (\alpha^{j1})^{2t} + (\alpha^{j2})^{2t} + \ldots + (\alpha^{jr})^{2t}$$

We simplify the above formula as follows:

$$S_1 = \beta_1 + \beta_2 + \ldots + \beta_r$$
$$S_2 = \beta_1^2 + \beta_2^2 + \ldots + \beta_r^2$$
$$\vdots$$
$$S_{2t} = (\beta_1)^{2t} + (\beta_2)^{2t} + \ldots + (\beta_r)^{2t}$$

As shown in step 842, we can define the error location polynomial $\sigma$ (x) and its roots is the inverse of the error location. From the above formula the roots can be $\beta_1^{-1}, \beta_2^{-1}, \ldots, \beta_r^{-1}$. Thus we can write $\sigma(x)$ as follows:

$$\sigma(x) = (1+\beta_1 x)(1+\beta_2 x) \ldots (1+\beta_r x)$$
$$= \sigma_0 + \sigma_1 x + \sigma_2 x^2 + \ldots + \sigma_r x^r$$

From the roots and coefficients of the above equation, we can get the followings:

$$\sigma_0 = 1$$
$$\sigma_1 = \beta_1 + \beta_2 + \ldots + \beta_r$$
$$\sigma_2 = \beta_1 \beta_2 + \beta_2 \beta_3 + \ldots + \beta_{r-1} \beta_r$$
$$\vdots$$
$$\sigma_r = \beta_1 \beta_2 \ldots \beta_r$$

and $$\sigma(\beta_l^{-1})=\sigma_0+\sigma_1\beta_l^{-1}+\sigma_2\beta_l^{-2}+\ldots+\sigma_r\beta_l^{-r}=0$$

Therefore, by solving $\sigma$ (x)=0, we can get the error locations. According to Newton's identities, we can establish the linear relationship between $\sigma_i$ and $S_j$. The above equations can be reconstructed to be t numbers of equations with t numbers of unknown. These equations can be expressed as a matrix form of a linear equation:

$$\begin{bmatrix} S_1 & S_2 & \ldots & S_t \\ S_2 & S_3 & \ldots & S_{t+1} \\ \vdots & \vdots & \ddots & \vdots \\ S_t & S_{t+1} & \ldots & S_{2t-1} \end{bmatrix} \begin{bmatrix} \sigma_t \\ \sigma_{t-1} \\ \vdots \\ \sigma_1 \end{bmatrix} = \begin{bmatrix} S_{t+1} \\ S_{t+2} \\ \vdots \\ S_{2t} \end{bmatrix}$$

Several ways of solving the above matrix equations: PGZ algorithm (PetersonGorensteinZierler Algorithm), BM algorithm (BerlekampMassey Algorithm), and the Euclidean algorithm (Euclidean Algorithm). We describe the BM algorithm in the followings:

BM algorithm is a iterative method to calculate the associated polynomial $S_j=r(\alpha_j)$, the first step is to find the smallest power polynomial $\sigma^1$ (x), so it satisfies the first equation:

$$S_1+\sigma_1^{(1)}=0$$

The next step is to substituted $\sigma^{(1)}$ (x) into the following formula:

$$S_2+\sigma_1^{(1)}S_1+2\sigma_2^{(1)}=0$$

If the substitution satisfies the above equation, we let $$\sigma^{(2)}(x)=\sigma^{(1)}(x)$$

Otherwise, we amended $\sigma(x)$ as follows:

$$\sigma^{(n+1)}(x)=\sigma^{(n)}(x)-d_n d_m^{-1} x^{(n-m)} \sigma^{(n)}(x)$$

Wherein $$d_n=S_{n+1}+\sigma_1^{(n)}S_n+\sigma_2^{(n)}S_{n-1}+\ldots+\sigma_{l_n}^{(n)}S_{n+1-l_n}$$

And the above iteration stop when $i \geq l_{i+1}+t_d-1$ or $i=2t_d-1$.

As shown in step 852, in finding the roots of error location polynomial, no effective algorithm can be found currently and the only way is to substitute the values into the error location polynomial by Chien search.

As shown in step 862, after using of Forney algorithm, the formula is as follows:

$$e_{j_l} = \frac{(\alpha^{j_l})^{2-b} \cdot \Lambda(\alpha^{-j_l})}{\sigma'(\alpha^{-j_j})}$$

Wherein $\Lambda(x)=\sigma(x)\cdot(x) \mod X^{2 \cdot td+1}$ and td is the numbers of corrected code words, and $$S(x)=1+S_1 x+S_2 x^2+\ldots+S_{2 \cdot t_d+1} x^{2 \cdot td}.$$

Thus, as shown in step 872, the receiver can get the original code word C (x)=r (x)+e (x), where r (x) is the received signal, e (x) is the error polynomial we derived.

As shown in FIG. 8, if the pocket loss occurs, the RS decoding procedure becomes the erase code correction. In order to decode the erase code correction of the RS code, we adopt the following erase position polynomial $$\tau(x) = \prod_{l=1}^{\mu} (1+y_{i_l} x)$$

With the modified Forney modifier $$T(x)=S(x)\cdot\tau(x)+1 \mod x^{2t_d+1}.$$

Because the Forney modifier is modified as above, we redefine the $d_i$ as follows:

$$d_i = T_{i+\mu+1} + \sum_{j=1}^{l_i} \sigma_j^{(i)} T_{i+\mu+1-j}$$

The $d_0$ is $T_{i+\mu+1}$ and the iteration stop when $i \geq l_{i+1}+t_d-1-\mu/2$.

When the iteration meets the iteration stop condition, the algorithm was stop and we get a $\sigma(x)$. With the $\sigma(x)$, we can calculate the value correction polynomial $\omega(x)$:

$$\omega(x)=[1+T(x)]\sigma(x) \mod x^{2t_d+1}.$$

And the position correction polynomial $\psi(x)$:

$$\phi(x)=\tau(x)\sigma(x)$$

With the modified Forney algorithm, we can calculate the following equation for the error value:

$$e_{j_l} = \frac{(\alpha^{j_l})^{2-b}\omega(\alpha^{-j_l})}{\phi'(\alpha^{-j_l})}$$

Wherein $1 \leq l \leq v$ and the erased value can be derived from $$f_{i_l} = \frac{(\alpha^{i_l})^{2-b}\omega(\alpha^{-i_l})}{\phi'(\alpha^{-i_l})}$$

So we can get $C(x)$ by $C(x)=R(x)+e(x)+f(x)$ and the decoding procedure end.

In the followings, we describe the LDPC code implementation of the third embodiment of the present invention. The LDPC code is a linear block code, so it is encoded like other linear block code. The parity check matrix H of the LDPC code is a sparse matrix and will correspond to a generator matrix G satisfying the following equation:

$$G \cdot H^T = 0.$$

And the coding is done by $c=m\cdot G$, wherein the m is the message to be transmitted.

A lot of design for the parity check matrix have been presented. A common design, such as Gallager codes are as follows:

$$H = \begin{bmatrix} H_0 \\ H_0 \prod_1 \\ \vdots \\ H_0 \prod_{w_c-1} \end{bmatrix}$$

$$H_0 = \begin{bmatrix} \overbrace{11 \ldots 1}^{w_r} & \overbrace{00 \ldots 0}^{w_r} & \ldots & \overbrace{00 \ldots 0}^{w_r} \\ 00 \ldots 0 & 11 \ldots 1 & \ldots & 00 \ldots 0 \\ \vdots & \vdots & \ddots & \vdots \\ 00 \ldots 0 & 00 \ldots 0 & \ldots & 11 \ldots 1 \end{bmatrix}$$

Wherein $\pi_i$, $i=1 \ldots w_C-1$ means the permutation of $H_0$.

In the implementation, since the parity check matrix is sparse, we need only produce a 1 position so that we can create the whole parity check matrix. Taking a 15 by 20 parity check matrix H for example: we use an array and put the number from 0 to 19 into the array, these 20 values represent the numerical line, in other words, a value of 9 would represent the 9th row. It is shown in FIG. 12.

The next step is to establish $H_0$:

$$H_0 = \begin{bmatrix} 0 & 1 & 2 & 3 \\ 4 & 5 & 6 & 7 \\ 8 & 9 & 10 & 11 \\ 12 & 13 & 14 & 15 \\ 16 & 17 & 18 & 19 \end{bmatrix}$$

The establish of $H_0$ is to take 4 data out of the array of FIG. 12 at a time and put into the $H_0$ in order.

In order to avoid the short ring with length 4, we have to permute H0 as follows:

$$H_1 = \begin{bmatrix} 0 & 17 & 14 & 11 \\ 4 & 1 & 18 & 15 \\ 8 & 5 & 2 & 19 \\ 12 & 9 & 6 & 3 \\ 16 & 13 & 10 & 7 \end{bmatrix}$$

By comparing H1 with H0, we can know that the first column of H1 is the same as the first column of H0. Every data in the second row of H1 is moved to the next column and the fifth column of the second row of H1 is moved to the first column. Every data in the third row of H1 is moved to the next two columns, . . . , and so on. Therefore, we can get the following relationship about H1:

If we assume $$H_0=(h_{ij})_{1 \leq i \leq 5, 1 \leq j \leq 4}$$

Then $$H_1=(h_{ij}')$$

and $$h_{ij}'=h_{kj}$$

Wherein $k=(i+j) \mod 5$, so we can get H1. We can establish H2 in a similar way.

H2 is not established from H0 but H1.

$$H_2=(h_{ij}'')$$

and $$h_{ij}''=h_{kj}'$$

Wherein $k=(i+j) \mod 5$ and the H2 is $$H_2 = \begin{bmatrix} 16 & 9 & 2 & 15 \\ 0 & 13 & 6 & 19 \\ 4 & 17 & 10 & 3 \\ 8 & 1 & 14 & 7 \\ 12 & 5 & 18 & 11 \end{bmatrix}$$

Thus, a 15 by 20 parity check matrix H can be established as follows:

$$H = \begin{bmatrix} H_0 \\ H_1 \\ H_2 \end{bmatrix}$$

In order to enhance the ability for decoding and encoding, we need to create a random parity check matrix structure, we can make a little amendment to the above method. We reconstruct the array of FIG. 12 to be the array of FIG. 13. The values between 0 to 19 after a random permutation is replaced in the array, then we can establish a parity check matrix H like Gallager code.

The followings are the LDPC decoding procedure.
LDPC codes decoding algorithm adopts primarily the method of message passing algorithm, so the decoding algorithm is as follows:
(0) initial:

$$q_{ij}(0) = 1 - p_i = P_r(x_i = +1/y_i) = \frac{1}{1 + e^{2y_i/\sigma^2}}$$

$$q_{ij}(1) = p_i = P_r(x_i = -1/y_i) = \frac{1}{1 + e^{2y_i/\sigma^2}}$$

$$r_{ji}(0) = \frac{1}{2} + \frac{1}{2} \prod_{i' \in R_j \setminus i} (1 - 2q_{i'j}(1)) \quad (1)$$

$$r_{ji}(0) = 1 - r_{ji}(0)$$

$$q_{ij}(0) = K_{ij}(1 - p_i) \prod_{j' \in C_i \setminus j} r_{j'i}(0) \quad (2)$$

$$q_{ij}(1) = K_{ij} p_i \prod_{j' \in C_i \setminus j} r_{j'i}(1)$$

Wherein Kij is a constant to make qij(0)+qij(1)=0.
(3) for any i, $$Q_i(0) = K_i(1 - p_i) \prod_{j \in C_i} r_{ji}(0)$$

$$Q_i(1) = K_i p_i \prod_{j \in C_i} r_{ji}(1)$$

Wherein Ki is a constant to make Qi(0)+Qi(1)=1.

$$\cdot \forall i \quad (4)$$

$$\tilde{C} = \begin{cases} 1 & \text{if } Q_i(1) > 0.5 \\ 0 & \text{else} \end{cases}$$

$$\cdot \text{if } \hat{\tilde{C}} H^T = \bar{0}$$

or the iteration number is equal to the maximum iteration number, then stop, otherwise return to (1).

Figure 14:
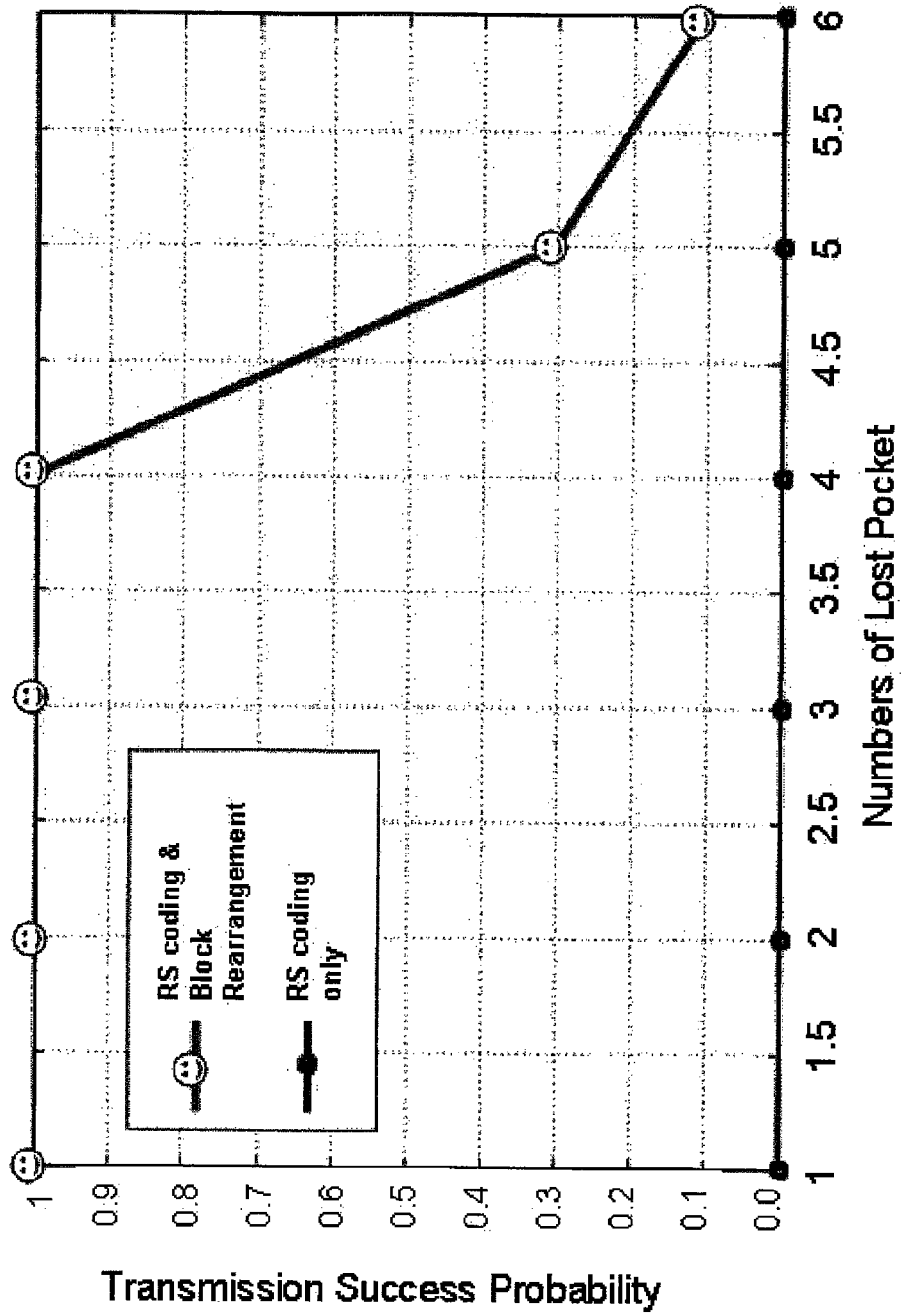
FIG. 14 is a diagram showing the packet loss versus transmission success rate.

FIG. 14 is a diagram showing the packet loss v.s. transmission success probability for the first embodiment of the present invention. The comparison is made between RS coding with block rearrangement and RS coding without block rearrangement. With RS coding and block rearrangement, 15 RS(15,7,9) packets are used for simulation. Each code word contains four characters and the overall data are 900 characters. Without block rearrangement, a RS (127,63,65) packet is used for simulation. Each code word contains 7 characters and the overall data are 899 characters. The pocket without block rearrangement is then divided into 15 packets for transmission. The success of the packet transmission does not allow any one bit error. The channel is without noise interference but with packets lost interference. The simulation results show that without block rearrangement, a packet loss makes the transmission fail; but with block rearrangement, we can successfully restore the data on condition that 4 pockets are lost.

Figure 15:
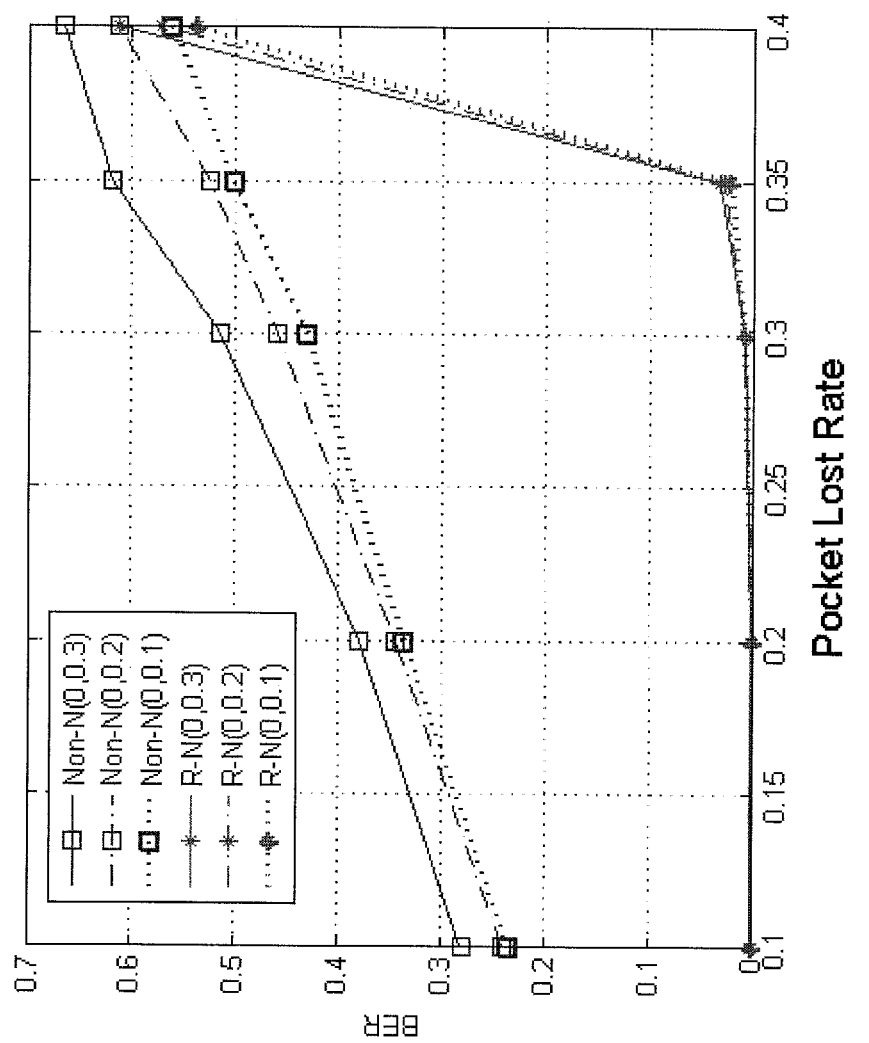
FIG. 15 is a diagram showing the packet loss versus bit error rate.

FIG. 15 is a diagram showing the packet loss v.s. bit error rate for the second embodiment of the present invention. The first error correction code adopts RS code and the second error correction code adopts LDPC code. The channel is with noise interference and packets lost interference. We simulate for the 1000 times transmission and each transmission transmits 15 fixed size packets.

We use the RS(15,8,7) coding in the simulation. In the LDPC codes encoding, we adopted a code rate of 1/2. We assume that the channel with the packet loss interference and the noise interference. We use simulated Gaussian noise with variance from 0.1 to 0.3.

In FIG. 15, RN represents block rearrangement and Non-N represents no block rearrangement. The RS(127,63,65) code is used without block rearrangement. The simulation shows that the EBR is lower with the block rearrangement.

Although the present invention and its advantages have been described in detail, as well as some variations over the disclosed embodiments, it should be understood that various other switches, substitutions and alterations can be made herein without departing from the spirit and scope of the invention as defined by the appended claims.

What is claimed is:

1. A method of digital signal error correction with block rearrangement and error correcting code, comprising the steps of:
    (a) dividing a first data stream into a first row of blocks, wherein the first row contains N blocks and each block contains M code words;
    (b) applying a first error correction code coding on each block of the first row to transform the first row into a second row, wherein the second row contains N blocks and each block contains L code words;
    (c) applying block rearrangement on the second row to become a third row, wherein the 1st code word of each block in the second row are placed into the 1st block of the third row in sequence, then the 2nd code word of each block in the second row are placed into the 2nd block of the third row in sequence, then the $X^{th}$ code word of each block in the second row is placed into the $X^{th}$ block of the third row in sequence, respectively, until the $L^{th}$ code word of each block in the second row is placed into the $L^{th}$ block of the third row in sequence, respectively, the 3rd row contains L blocks and each block contains N code words, L, X and N are integers, and 2<X<L;
    (d) adding each block of the third row with a header to become a 4th row, wherein the 4th row contains L blocks and each block contains P code words;
    (e) applying a second error correction code coding on each block of the 4th row to transform the 4th row into a 5th row, wherein the 5th row contains L blocks and each block contains R code words;
    (f) transmitting the 5th row via a channel;
    (g) receiving the 5th row and applying the second error correction code decoding on each block of the 5th row to transform the 5th row into a 6th row, wherein the 6th row contains I blocks, each block contains P code words, the number of lost block is J and I=L−J;

(h) removing the header of each block of the 6th row to become the 7th row, wherein the 7th row contains I blocks and each block contains N code words;

(i) applying reverse block rearrangement on the 7th row to become an 8th row, wherein the 1st code word of each block in the 7th row is placed into the 1st block of the 8th row in sequence, then the 2nd code word of each block in the 7th row is placed into the 2nd block of the 8th row in sequence, then the $K^{th}$ code word of each block in the 7th row is placed into the $K^{th}$ block of the 8th row in sequence, respectively, until the $L^{th}$ code word of each block in the 7th row is placed into the $L^{th}$ block of the 8th row in sequence, the 8th row contains L blocks and each block contains N code words, L, K and N are integers, and 2<K<L;

(j) applying the first error correction code decoding on each block of the 8th row to transform the 8th row into a 9th row, wherein the second row contains N blocks and each block contains M code words; and (k) combining the blocks of the 9th row to become a second data stream.

2. The method of digital signal error correction with block rearrangement and error correcting code of claim 1, wherein the first error correction code is chosen from a first group consisting of turbo code, Reed Solomon code, low density parity check code, BCH codes, eIRA code and QC-LDPC codes; and the second error correction code is chosen from a second group consisting of turbo code, Reed Solomon code, low density parity check code, BCH codes, eIRA code and QC-LDPC codes.

* * * * *